(12) United States Patent
Cai et al.

(10) Patent No.: US 8,492,218 B1
(45) Date of Patent: Jul. 23, 2013

(54) REMOVAL OF AN OVERLAP OF DUAL STRESS LINERS

(75) Inventors: Ming Cai, Hopewell Junction, NY (US); Aimin Xing, Fishkill, NY (US); Chandra Reddy, LeGrangeville, NY (US)

(73) Assignees: International Business Machines Corporation, Armonk, NY (US); Global Foundries, Inc., Grand Cayman (KY)

( * ) Notice: Subject to any disclaimer, the term of this patent is extended or adjusted under 35 U.S.C. 154(b) by 0 days.

(21) Appl. No.: 13/438,422

(22) Filed: Apr. 3, 2012

(51) Int. Cl.
*H01L 21/8238* (2006.01)

(52) U.S. Cl.
USPC ..... 438/199; 438/275; 438/739; 257/E21.632

(58) Field of Classification Search
USPC .......... 438/199, 275, 739, 791; 257/E21.632, 257/E21.483
See application file for complete search history.

(56) References Cited

U.S. PATENT DOCUMENTS

| | | | |
|---|---|---|---|
| 6,632,741 B1 * | 10/2003 | Clevenger et al. | 438/689 |
| 7,183,613 B1 | 2/2007 | Zhu et al. | |
| 7,727,834 B2 * | 6/2010 | Sudo | 438/228 |
| 7,816,271 B2 * | 10/2010 | Lee et al. | 438/702 |
| 7,843,024 B2 | 11/2010 | Chidambarrao et al. | |
| 7,911,001 B2 | 3/2011 | Lee et al. | |
| 7,943,454 B2 | 5/2011 | Chen et al. | |
| 2005/0093030 A1 | 5/2005 | Doris et al. | |
| 2007/0029635 A1 * | 2/2007 | Smith et al. | 257/510 |
| 2008/0124937 A1 * | 5/2008 | Xu et al. | 438/724 |
| 2008/0169510 A1 * | 7/2008 | Kumar et al. | 257/368 |
| 2008/0179638 A1 | 7/2008 | Dyer et al. | |
| 2009/0090974 A1 * | 4/2009 | Costrini et al. | 257/369 |
| 2010/0013045 A1 * | 1/2010 | Weeks | 257/529 |

OTHER PUBLICATIONS

Zhu, H. et al., "Improving Yields of High Performance 65nm Chips with Sputtering Top Surface of Dual Stress Liner" 2007 IEEE Symposium on VLSI Technology Digest of Technical Papers (Jun. 12-14, 2007), pp. 180-181.

Yang, H.S. et al., "Dual Stress Liner for High Performance sub-45nm Gate Length SOI CMOS Manufacturing" IEEE International Electron Devices Meeting 2004, IEDM Technical Digest (Dec. 13-15, 2004) pp. 1075-1077.

Leobandung, E. et al., "High Performance 65nm SOI Technology with Dual Stress Liner and Low Capacitance SRAM Cell" 2005 IEEE Symposium on VLSI Technology Digest of Technical Papers (Jun. 14-16, 2005), pp. 126-127.

* cited by examiner

*Primary Examiner* — Tuan N. Quach
(74) *Attorney, Agent, or Firm* — Scully, Scott, Murphy & Presser, P.C.; Yuanmin Cai (57) ABSTRACT

A first liner and a second liner are formed such that a peripheral portion of the second liner overlies a peripheral portion of the first liner. A photoresist layer is applied and patterned such that a sidewall of a patterned photoresist layer overlies an overlapping peripheral portion of the second liner An isotropic dry etch is performed to laterally etch the overlapping peripheral portion of the second liner from below the patterned photoresist layer. The patterned photoresist is subsequently removed, and a structure without an overlap of the first and second liners is provided.

20 Claims, 9 Drawing Sheets

REMOVAL OF AN OVERLAP OF DUAL STRESS LINERS

BACKGROUND

The present disclosure generally relates to a method of manufacturing semiconductor devices, and particularly to a method of removing an overlap of dual stress liners.

Manipulating stress is an effective way of improving the minority carrier mobility in a metal oxide semiconductor field effect transistor (MOSFET) and increasing the transconductance (or reduced serial resistance) of the MOSFET that requires relatively small modifications to semiconductor processing while providing significant enhancement to MOSFET performance.

When stress is applied to the channel of a semiconductor transistor, the mobility of carriers, and as a consequence, the transconductance and the on-current of the transistor are altered from their original values for an unstressed semiconductor. This is because the applied stress and the resulting strain on the semiconductor structure within the channel affects the band gap structure (i.e., breaks the degeneracy of the band structure) and changes the effective mass of carriers. The effect of the stress depends on the crystallographic orientation of the plane of the channel, the direction of the channel within the crystallographic orientation, and the direction of the applied stress.

The effect of uniaxial stress, i.e., a stress applied along one crystallographic orientation, on the performance of semiconductor devices, especially on the performance of a MOSFET (or a "FET" in short) built on a silicon substrate, has been extensively studied in the semiconductor industry. For a p-type MOSFET (or a "PFET" in short) utilizing a silicon channel, the mobility of minority carriers in the channel (which are holes in this case) increases under uniaxial compressive stress along the direction of the channel, i.e., the direction of the movement of holes or the direction connecting the drain to the source. Conversely, for an n-type MOSFET (or an "NFET" in short) utilizing a silicon channel, the mobility of minority carriers in the channel (which are electrons in this case) increases under uniaxial tensile stress along the direction of the channel, i.e., the direction of the movement of electrons or the direction connecting the drain to the source. These opposite requirements for the type of stress for enhancing carrier mobility between the PMOSFETs and NMOSFETs have led to prior art methods for applying at least two different types of stress to the semiconductor devices on the same integrated chip.

A local stress is a stress that is applied only to local areas adjacent to a specific semiconductor device. For example, a local stress can be applied to a channel of a field effect transistor. One of the most common methods of applying a local stress is the use of stressed liners, or "stressed films". Since each stressed liner has a certain stress level, either compressive or tensile, two separate stressed liners, commonly called "dual liners," are used to separately create a tensile stress and a compressive stress in two different regions of the same integrated circuit. The film stack over the NFET area applies tensile stress to the underlying NFETs and the compressive film over the PFET area applies compressive stress to the underlying PFETs so that both PFETs and NFETs have enhanced performance through stress engineering.

The presence of a compressive film over portions of a PFET area near the boundaries between the PFET area and an NFET area according to the prior art is not advantageous, however, since the compressive film applies a compressive stress to the underlying PFETs through the tensile film and the optional dielectric layer. The tensile stress that the tensile film generates is therefore partially negated by the compressive stress that the overlying compressive film generates under the boundary region in which both the compressive film and the tensile film overlap.

Regions having an overlap of the compressive film and the tensile film are prone to an incomplete etch during contact via formation because the combined thickness of the compressive film and the tensile film is greater than the thickness of the compressive film or the thickness of the tensile film. Thus, the presence of an overlap of the compressive film and the tensile film is disadvantageous for high yield contact formation. Therefore, the overlap of the compressive film and a tensile film needs to be removed in a reliable and economical manner.

BRIEF SUMMARY

A first liner and a second liner are formed such that a peripheral portion of the second liner overlies a peripheral portion of the first liner. A photoresist layer is applied and patterned such that a sidewall of a patterned photoresist layer overlies an overlapping peripheral portion of the second liner An isotropic dry etch is performed to laterally etch the overlapping peripheral portion of the second liner from below the patterned photoresist layer. The patterned photoresist is subsequently removed, and a structure without an overlap of the first and second liners is provided.

According to an aspect of the present disclosure, a method of fabricating a semiconductor structure is provided, which includes: forming a first liner over a first portion of a semiconductor substrate; forming a second liner over a second portion of the semiconductor substrate, wherein the second liner overlies the first liner; depositing a masking layer over the first liner and the second liner; forming a sidewall of the patterned masking layer above a top surface of a peripheral portion of the first liner by patterning the masking layer; removing portions of the second liner that are not covered by the patterned masking layer; and laterally recessing the second liner from underneath the patterned masking layer, causing a peripheral portion of the second liner to be removed from above the peripheral portion of the first liner.

According to another aspect of the present disclosure, another method of fabricating a semiconductor structure is provided, which includes: forming one of one of a tensile-stress-generating liner and a compressive-stress-generating liner as a first liner over a first portion of a semiconductor substrate; forming another of the tensile-stress-generating liner and the compressive-stress-generating liner as a second liner over a second portion of the semiconductor substrate, wherein the second liner overlies the first liner; depositing a masking layer over the first liner and the second liner; forming a sidewall of the patterned masking layer above a top surface of a peripheral portion of the first liner by patterning the masking layer; removing portions of the second liner that are not covered by the patterned masking layer; and laterally recessing the second liner from underneath the patterned masking layer, causing a peripheral portion of the second liner to be removed from above the peripheral portion of the first liner.

According to yet another aspect of the present disclosure, yet another method of fabricating a semiconductor structure is provided, which includes: forming a first field effect transistor over the first portion of the semiconductor substrate and forming a second field effect transistor over the second portion of the semiconductor substrate; forming a first liner over the first and second portions of the semiconductor substrate;

removing a portion of the first liner from above the second field effect transistor; forming a second liner over the second portion of the semiconductor substrate and over the first liner; removing the second liner from above the second field effect transistor; depositing a masking layer over the first liner and the second liner; forming a sidewall of the patterned masking layer above a top surface of a peripheral portion of the first liner by patterning the masking layer; removing portions of the second liner that are not covered by the patterned masking layer; and laterally recessing the second liner from underneath the patterned masking layer, causing a peripheral portion of the second liner to be removed from above the peripheral portion of the first liner.

DETAILED DESCRIPTION

As stated above, the present disclosure relates to a method of manufacturing semiconductor devices, and particularly to a method of removing an overlap of dual stress liners, which is now described in detail with accompanying figures. It is noted that like and corresponding elements are referred to by like reference numerals. The drawings are not in scale.

Figure 1:
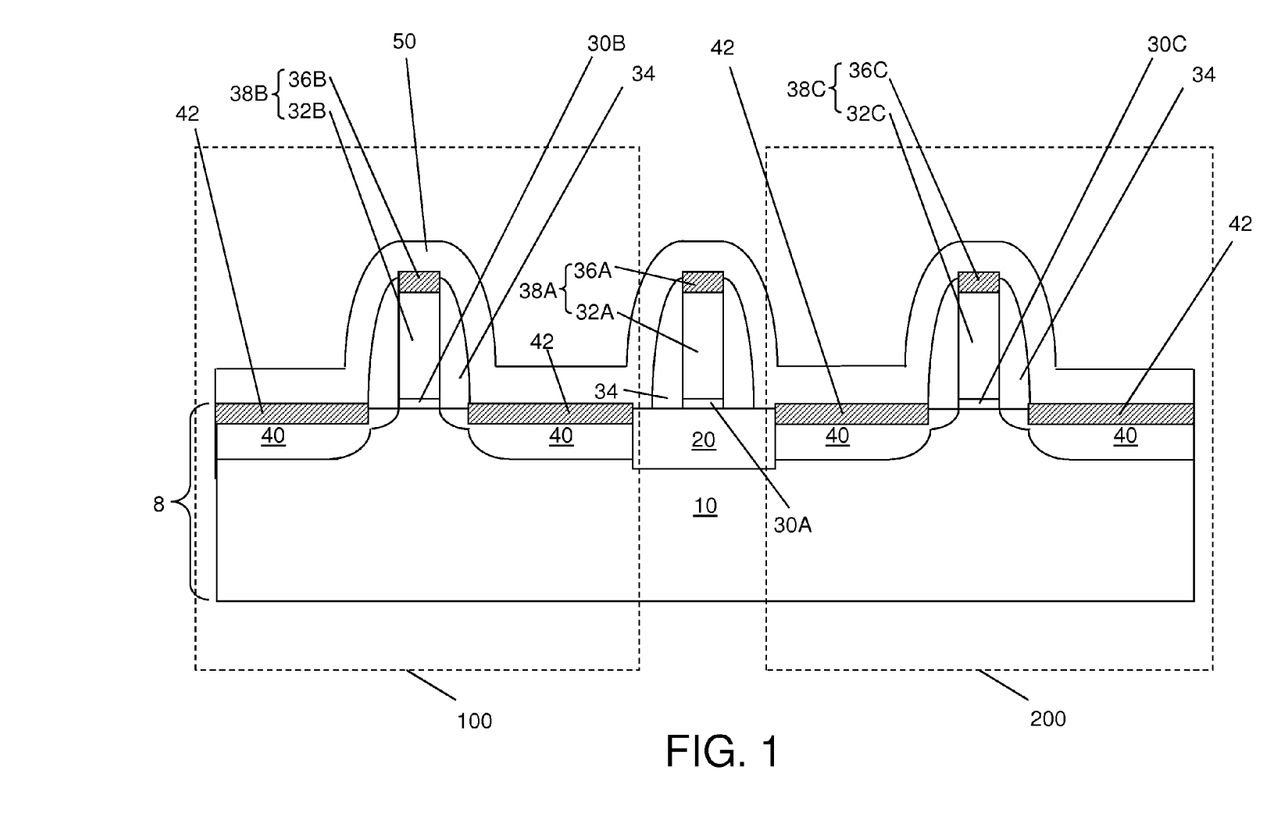
FIG. 1 is vertical cross-sectional view of an exemplary semiconductor structure after deposition of a first liner according to an embodiment of the present disclosure.

Referring to FIG. 1, an exemplary semiconductor structure according to an embodiment of the present disclosure includes a semiconductor substrate 8, gate stacks and gate spacers 34 formed upon the semiconductor substrate 8, and a first liner 50 formed above the gate stacks and the semiconductor substrate 8. The substrate 8 includes a semiconductor layer 10 including a semiconductor material. The semiconductor layer 10 can be a bulk semiconductor substrate or a top semiconductor layer of a semiconductor-on-insulator (SOI) substrate. The semiconductor layer 10 can include a single crystalline semiconductor material or a polycrystalline semiconductor material. The semiconductor material of the semiconductor layer 10 can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

The exemplary semiconductor structure includes a first device region 100 and a second device region 200, each of which is a region of the exemplary semiconductor structure including a semiconductor device. For example, a first field effect transistor can be formed in the first device region 100, and a second field effect transistor can be formed in the second device region 200. The first field effect transistor and the second field effect transistor can be transistors of the same type, i.e., p-type or n-type, or transistors of the opposite type. For example, the first device region 100 can include a p-type field effect transistor and the second device region 200 can include an n-type field effect transistor. Alternatively, the first device region 100 can include an n-type field effect transistor and the second device region 200 can include a p-type field effect transistor.

Doped wells (not shown), a shallow trench isolation structure 20, and various source and drain regions 40 are formed as known in the art. The various source and drain regions 40 can be doped with p-type dopants or n-type dopants depending on the type of the field effect transistor to be formed. Source/drain metal semiconductor alloy portions 42 can be formed on the various source and drain regions 40 employing methods known in the art.

Various gate stacks are formed in the first device region 100, the second device region 200, and a region between the first device region 100 and the second device region 200. For example, a first gate stack including a first gate dielectric 30A, a first gate conductor portion 32A, and a first gate metal semiconductor alloy portion 36A can be formed over the shallow trench isolation structure 20. A second gate stack including a second gate dielectric 30B, a second gate conductor portion 32B, and a second gate metal semiconductor alloy portion 36B can be formed in the first device region 100. A third gate stack including a third gate dielectric 30C, a third gate conductor portion 32C, and a third gate metal semiconductor alloy portion 36C. The stack of the first gate conductor portion 32A and the first gate metal semiconductor alloy portion 36A constitutes a first gate electrode 38A, which can be a gate electrode of another field effect transistor or can be a dummy structure. The stack of the second gate conductor portion 32B and the second gate metal semiconductor alloy portion 36B constitutes a second gate electrode 38B, which is the gate electrode of the first field effect transistor in the first device region 100. The stack of the third gate conductor portion 32C and the third gate metal semiconductor alloy portion 36C constitutes a third gate electrode 38C, which is the gate electrode of the second field effect transistor in the second device region 200.

A first liner 50 is deposited on the entire physically exposed surfaces of the front side of the exemplary structure. Thus, the first liner 50 is deposited both in the first device region 100 and in the second device region 200. The first liner 50 can be a dielectric film. The first liner 50 can be a silicon nitride, a silicon oxide, a silicon oxynitride, another dielectric material, or a stack of such materials. In one embodiment, the first liner 50 is a silicon nitride film.

In one embodiment, the first device region 100 includes a first field effect transistor and the second device region 200 includes a second field effect transistor, and one of the first field effect transistor and the second field effect transistor is a p-type field effect transistor, and another of the first field effect transistor and the second field effect transistor is an n-type field effect transistor.

The first liner 50 can be deposited by a conformal or a non-conformal deposition process. In one embodiment, the first liner 50 can be deposited by chemical vapor deposition (CVD). Various methods of CVD are available such as low pressure chemical vapor deposition (LPCVD), plasma enhanced chemical vapor deposition (PECVD), sub-atmospheric chemical vapor deposition (SACVD) and high density plasma (HDP) deposition. In one embodiment, plasma enhanced chemical vapor deposition is used for deposition of the first liner 50.

The first liner 50 provides a first stress at least to the channel of the first device region 100. The first liner 50 can be a compressive-stress-generating liner or a tensile-stress-generating liner. In one embodiment, the first liner 50 can be a compressive-stress-generating silicon nitride liner or a tensile-stress-generating silicon nitride liner.

If the first device region 100 includes an n-type field effect transistor, the first liner 50 can apply a tensile stress to the channel of the n-type field effect transistor, i.e., the first liner 50 can be a tensile-stress-generating liner. The magnitude of the tensile stress can be greater than 150 MPa. In one embodiment, the magnitude of the tensile stress can be greater than 500 MPa. If the first device region 100 includes a p-type field effect transistor, the first liner 50 can apply a compressive stress to the channel of the p-type field effect transistor. The magnitude of the compressive stress can be greater than 150 MPa. In one embodiment, the magnitude of the compressive stress can be greater than 500 MPa. As deposited and prior to patterning of the first liner 50, the first liner applies the same level of stress to other devices below including the second device region 200.

The first liner 50 directly contacts topmost surfaces of the gate electrodes (38A, 38B, 38C) of the first device region 100. Further, the first liner 50 directly contacts the source/drain metal semiconductor alloy portions 42 in the first and second device regions (100, 200). In addition, the first liner 50 directly contacts the spacers 34 in the first and second device regions (100, 200) and above the shallow trench isolation structure 20. The first liner 50 can directly contact the shallow trench isolation structure 20. The thickness of the first liner 50 can be in the range from 50 nm to 100 nm, although lesser and greater thicknesses can also be employed.

Figure 2:
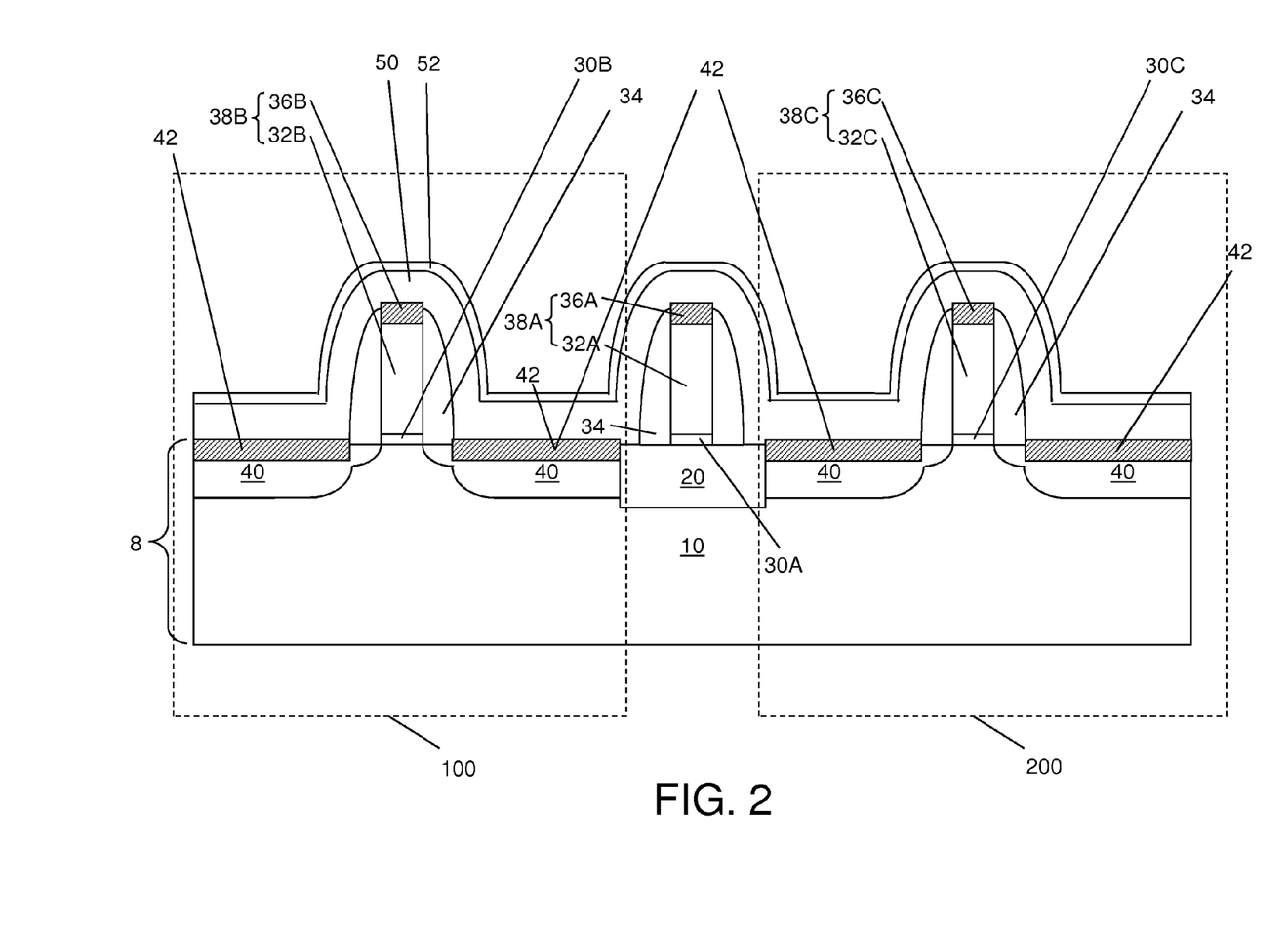
FIG. 2 is a vertical cross-sectional view of the exemplary semiconductor structure after deposition of a dielectric material layer according to an embodiment of the present disclosure.

Referring to FIG. 2, a dielectric material layer 52 is deposited. The dielectric material layer 52 can be deposited by a conformal or a non-conformal deposition process. The dielectric material layer 52 has a different composition than the first liner 50. For example, the first liner 50 can be a tensile-stress-generating silicon nitride liner or a compressive-stress-generating silicon nitride liner, and the dielectric material layer 52 can be a silicon oxide layer.

In one embodiment, the dielectric material layer 52 can be deposited by chemical vapor deposition (CVD). The thickness of the dielectric material layer 52 can be from 5 nm to 50 nm, although lesser and greater thicknesses can also be employed.

In one embodiment, the dielectric material layer 52 is an etch stop layer. The material of the dielectric material layer 52 is a material that is different from the material of a second liner to be subsequently deposited. Specifically, the material of the dielectric material layer 52 can be selected such that the etch process used for etching of the second liner is selective to the dielectric material layer, and does not substantially etch the dielectric material layer 52.

Figure 3:
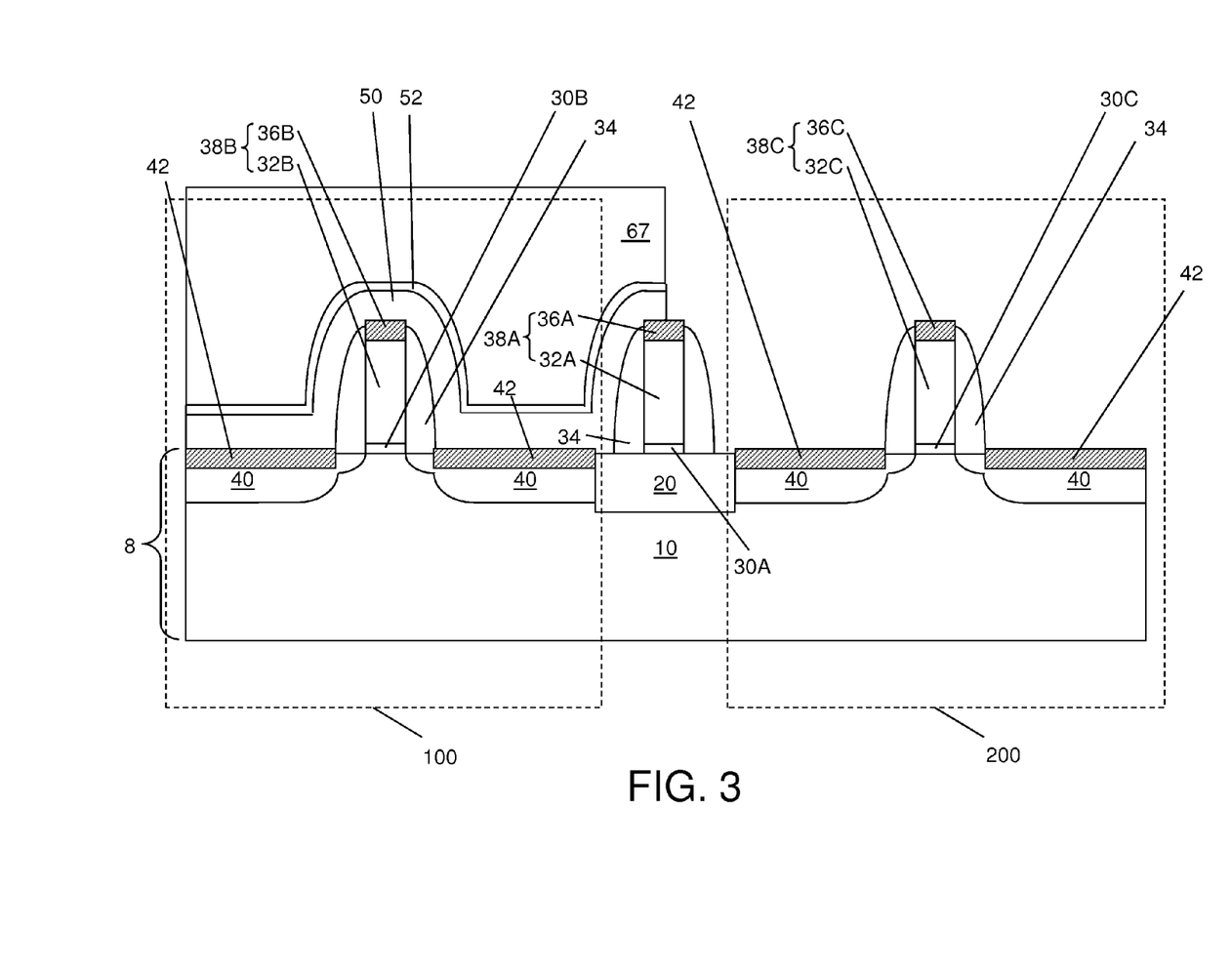
FIG. 3 is a vertical cross-sectional view of the exemplary semiconductor structure after patterning of the dielectric material layer and the first liner employing a patterned photoresist layer as an etch mask layer according to an embodiment of the present disclosure.

Referring to FIG. 3, a photoresist layer 67 is applied over the top surface of the semiconductor substrate 8 and lithographically patterned such that an edge of the patterned photoresist layer 67 overlies a gate stack of a the first gate dielectric 30A and the first gate electrode 38A. Thus, the edge of the patterned photoresist layer 67 can overlie the first gate electrode 38A and the shallow trench isolation structure 20. After patterning of the first photoresist layer 67, the area of the first device region 100 is covered with the patterned photoresist layer 67 while the area of the second device region 200 is physically exposed.

An etch is performed to remove the portions of the dielectric material layer 52 that are not covered by the photoresist layer 67. The etch can be an anisotropic etch such as a reactive ion etch, an isotropic dry etch, or an isotropic wet etch. The etch removes the physically exposed portions of the dielectric material layer 52 employing the photoresist layer 67 as an etch mask, thereby physically exposing the portions of the first liner 50 in areas that are not covered by the patterned photoresist layer 67. Subsequently, the etch removes the portions of the first liner 50 that are not physically covered by the patterned photoresist layer 67. The removal of the material of the first liner 50 can be selective to the underlying materials, i.e., the materials of the first and third gate metal semiconductor alloy portions (36A, 36C), the gate spacers 34, the shallow trench isolation structure 20, and the source/drain metal semiconductor alloy portions 42.

Upon patterning of the dielectric material layer 52 and the first liner 50, a sidewall of the dielectric material layer 52 and a sidewall of the first liner 50 are physically exposed. In one embodiment, the sidewall of the dielectric material layer 52 can be vertically coincident with the sidewall of the first liner 50, i.e., coincide in a vertical top-down view with the sidewall of the first liner 50. The vertical coincidence of the sidewall of the dielectric material layer 52 and the sidewall of the first liner 50 can be effected, for example, by performing an anisotropic etch such as a reactive ion etch to remove the physically exposed portions of the dielectric material layer 52 and the physically exposed portions of the first liner 50. The photoresist layer 67 is subsequently removed, for example, by ashing.

Figure 4:
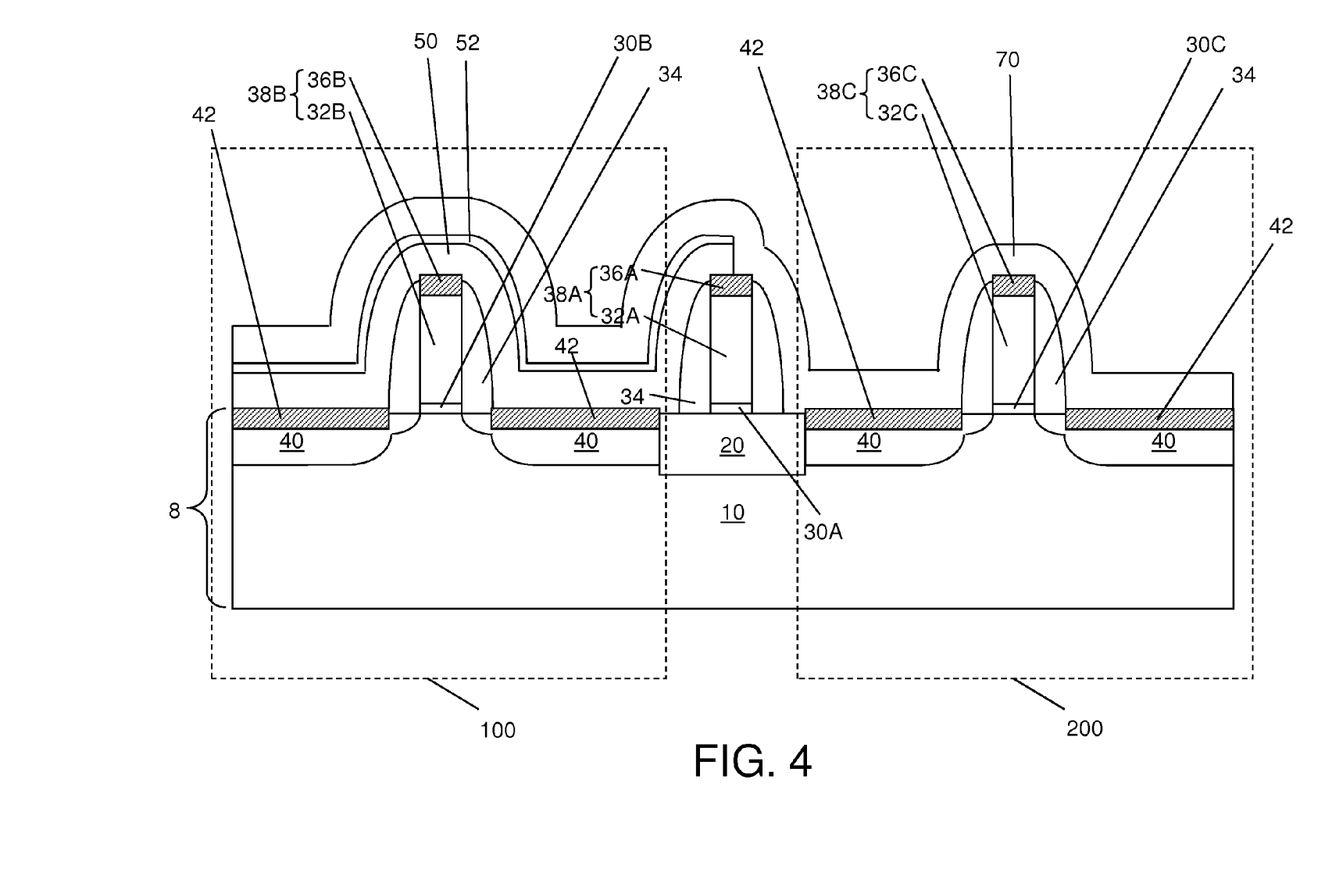
FIG. 4 is a vertical cross-sectional view of the exemplary semiconductor structure after removal of the patterned photoresist layer according to an embodiment of the present disclosure.

Referring to FIG. 4, a second liner 70 is deposited over the patterned first liner 50 and the patterned dielectric material layer 52. The second liner 70 is in direct contact with a top surface of the dielectric material layer 52 in the entirety of the first device region 100, a sidewall of the first liner 50, a top surface of the first gate electrode 38A and a top surface of the third gate electrode 38C, outer surfaces of gate spacers 34 that include a dielectric material, and top surfaces of source/drain metal semiconductor alloy portions 42 in the second device region 200.

The second liner 70 can be a dielectric film. The second liner 70 can be a silicon nitride, a silicon oxide, a silicon oxynitride, another dielectric material, or a stack of such materials. In one embodiment, the first liner 50 and the second liner 70 are silicon nitride films having different levels of stress.

The second liner 70 can be deposited by a conformal or a non-conformal deposition process. In one embodiment, the second liner 70 can be deposited by chemical vapor deposition (CVD). Various methods of CVD are available such as low pressure chemical vapor deposition (LPCVD), plasma enhanced chemical vapor deposition (PECVD), sub-atmospheric chemical vapor deposition (SACVD) and high density plasma (HDP) deposition. In one embodiment, plasma enhanced chemical vapor deposition is used for deposition of the second liner 70.

The second liner 70 provides a second stress at least to the channel of the first device region 100. The second stress is different from the first stress in polarity and/or in magnitude. For example, the first liner 50 can be a compressive-stress-generating liner and the second liner 70 can be a tensile-stress-generating liner. Alternately, the first liner 50 can be a tensile-stress-generating liner and the second liner 70 can be a compressive-stress-generating liner. In one embodiment, the first liner 50 can be a compressive-stress-generating silicon nitride liner and the second liner 70 can be a tensile-stress-generating silicon nitride liner. In another embodiment, the first liner 50 can be a tensile-stress-generating silicon nitride liner and the second liner 70 can be a compressive-stress-generating silicon nitride liner.

If the first device region 100 includes an n-type field effect transistor and the second device region 200 includes a p-type field effect transistor, the first liner 50 can apply a tensile stress to the channel of the n-type field effect transistor and the second liner 70 can apply a compressive stress to the channel of the p-type field effect transistor, i.e., the first liner 50 can be a tensile-stress-generating liner and the second liner 70 can be a compressive-stress-generating liner. The magnitude of the tensile stress can be greater than 150 MPa, and/or the magnitude of the compressive stress can be greater than 150 MPa. In one embodiment, the magnitude of the tensile stress can be greater than 500 MPa and/or the magnitude of the compressive stress can be greater than 500 MPa.

If the first device region 100 includes a p-type field effect transistor and the second device region 200 includes an n-type field effect transistor, the first liner 50 can apply a compressive stress to the channel of the p-type field effect transistor and the second liner 70 can apply a tensile stress to the channel of the n-type field effect transistor. The magnitude of the compressive stress can be greater than 150 MPa, and/or the magnitude of the tensile stress can be greater than 150 MPa. In one embodiment, the magnitude of the compressive stress can be greater than 500 MPa, and/or the magnitude of the tensile stress can be greater than 500 MPa. As deposited and prior to any patterning of the second liner 70, the second liner 70 can apply the same level of stress to other devices below including devices in the first device region 100.

The second liner 70 is in physical contact with the sidewall of the dielectric material layer 52 and the sidewall of the first liner 50 upon formation of the second liner 50. The thickness of the second liner 70 can be in the range from 50 nm to 100 nm, although lesser and greater thicknesses can also be employed.

Figure 5:
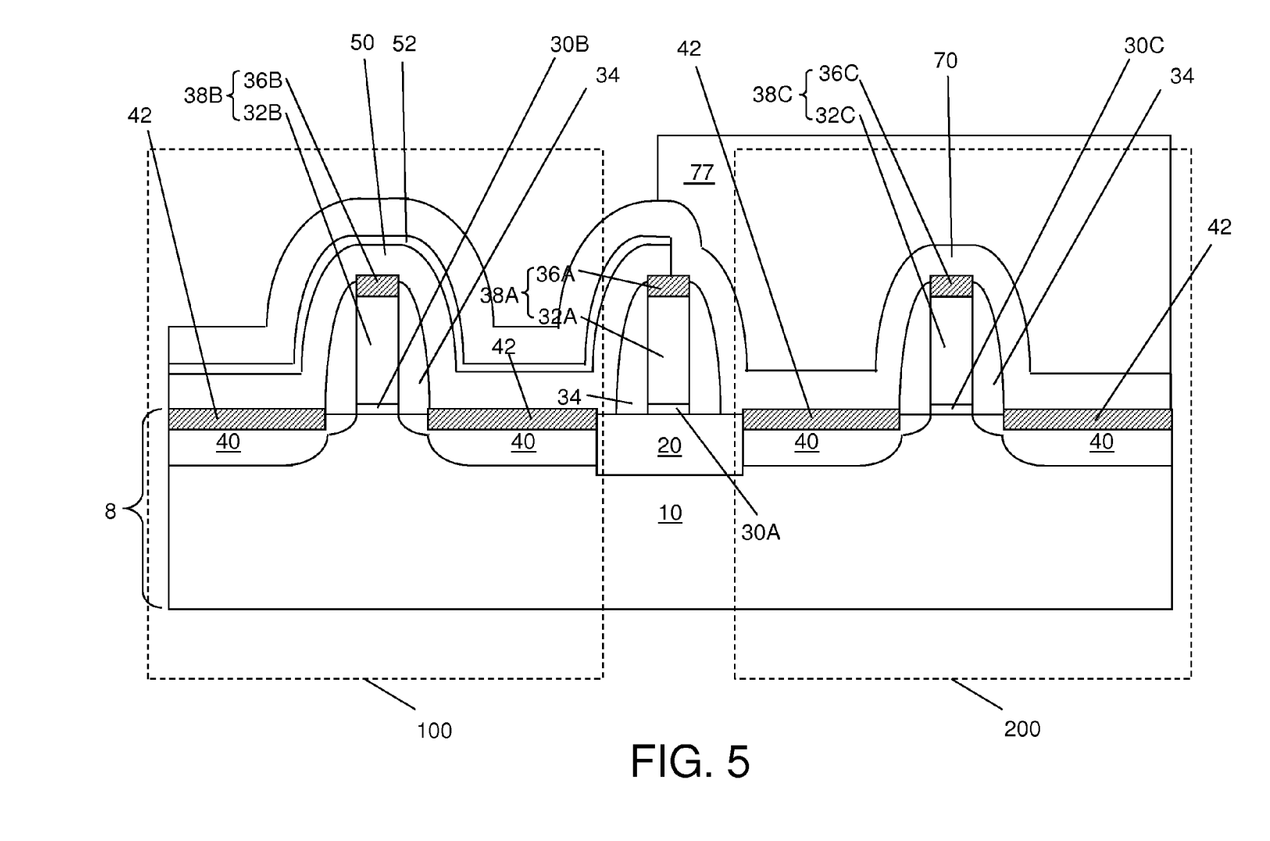
FIG. 5 is a vertical cross-sectional view of the exemplary semiconductor structure after application and patterning of a masking layer according to an embodiment of the present disclosure.

Referring to FIG. 5, a masking layer 77 is deposited on the top surface of the second liner 70. Thus, the masking layer 77 is deposited over the first liner 50 and the second liner 70. The masking layer 77 can be, for example, a photoresist layer.

The masking layer 77 is patterned such that the patterned masking layer 77 covers the entirety of the second device region 200, physically exposes the entirety of the first device region 100, and an edge (a vertical sidewall) of the masking layer 77 overlies a peripheral portion of the first liner 50 located above the first gate stack (30A, 38A). The edge of the patterned masking layer 77 is placed within proximity of the sidewall of the first liner 50 that overlies the first gate stack (30A, 38A). For example, the edge of the masking layer 77 can be laterally offset from the sidewall of the first liner 50 overlying the first gate stack (30A, 38A) by a distance in a range from 50% of the thickness of the second liner 70 to 200% of the thickness of the second liner 70. The edge of the masking layer 77 overlies a peripheral portion of the first liner 50 above the first gate stack (30A, 38A).

Figure 6:
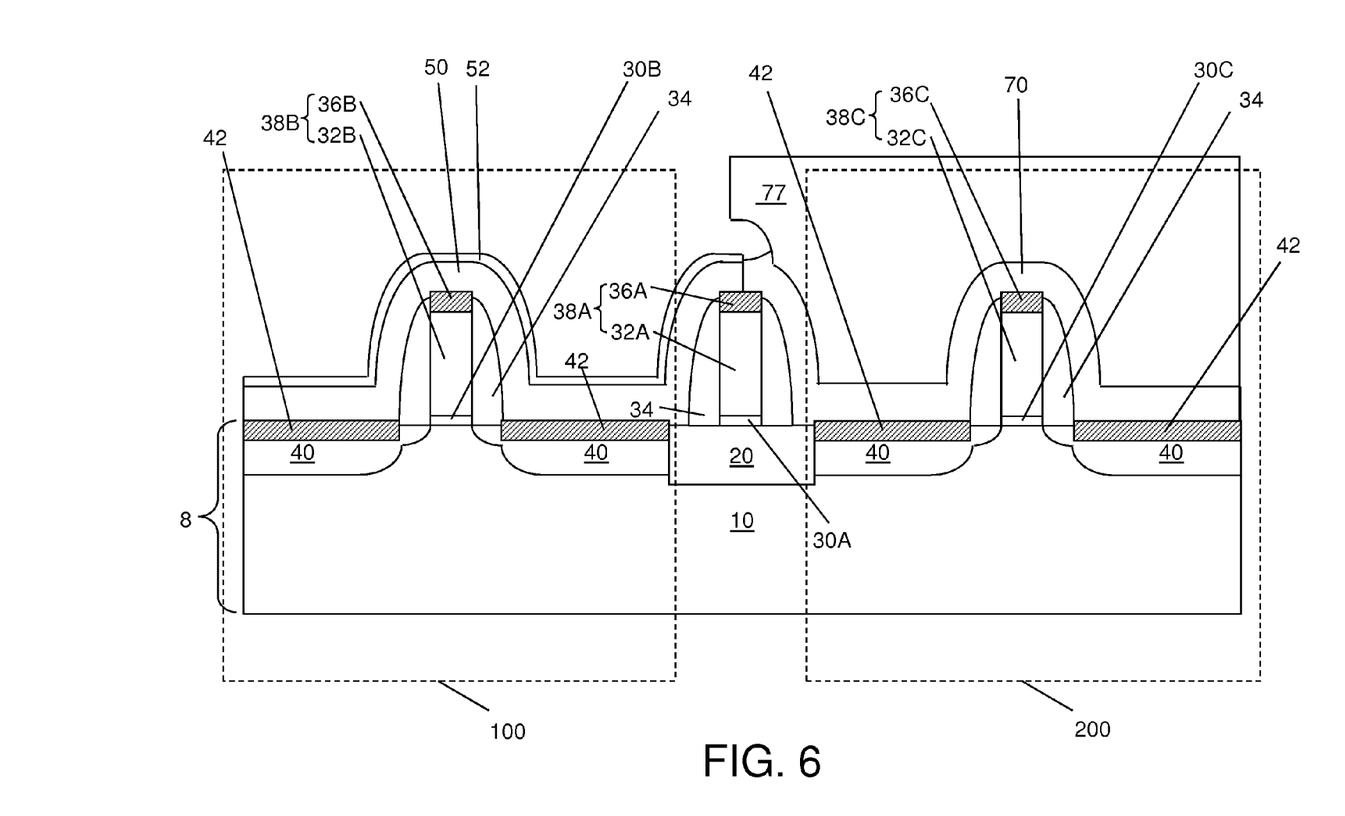
FIG. 6 is a vertical cross-sectional view of the exemplary semiconductor structure after lateral recessing of the second liner according to an embodiment of the present disclosure.

Referring to FIG. 6, portions of the second liner 70 that are not covered by the patterned masking layer 77 are removed by a first etch. The first etch can be selective to the dielectric material layer 52. Thus, a top surface of the dielectric material layer 52 is physically exposed in areas that are not covered by the masking layer 77 after the first etch. The portion of the second liner 70 located underneath the masking layer 77 is not removed by the first etch. Thus, the first liner 50 is present on a first portion of the semiconductor substrate 8 that includes the first device region 100, and the second liner 70 is present on a second portion of the semiconductor substrate 8 that includes the second device region 200. A peripheral portion of the second liner 70 overlies a peripheral portion of the first liner 50.

Subsequently, a peripheral portion of the second liner 70 in proximity to the edge of the masking layer 77 is laterally recessed by a second etch. The peripheral portion of the second liner 70 overlying the first gate stack (30A, 38A) is removed from above the peripheral portion of the first liner 50 overlying the first gate stack (30A, 38A). The first liner 50 is protected by the dielectric material layer while the second liner is laterally recessed.

In one embodiment, the lateral recessing of the peripheral portion of the second liner 70 can be performed employing a dry etch. In one embodiment, the dry etch can be an isotropic dry etch. In one embodiment, the isotropic dry etch can be a chemical downstream etch that generates a reactive ion or a radical in a chamber different from a chamber in which the semiconductor substrate 8 is loaded.

In one embodiment, lateral recessing can be performed employing a plasma of $CF_4$ and $O_2$ and optionally a plasma of $N_2$. In one embodiment, the lateral recessing can be performed by a chemical downstream etch that employs a plasma of $CF_4$ and $O_2$ and optionally a plasma of $N_2$. In another embodiment, the lateral recessing can be performed by a chemical downstream etch that employs a plasma of at least one of $NF_3$ and $NH_3$ and optionally a plasma of one or more of He, and Ar.

In one embodiment, the first etch and the second etch can be a single etch process employing the same chemistry. In one embodiment, the first etch and the second etch can be the same isotropic dry etch such as a chemical downstream etch.

In another embodiment, the first etch and the second etch can be different etch processes employing a different chemistry and/or energy and/or pressure. In one embodiment, the first etch can be an anisotropic etch such as a reactive ion etch, and the second etch can be can isotropic dry etch such as a chemical downstream etch.

A surface 79 of the second liner 70 adjoins one of the sidewall of the dielectric material liner 52 and the sidewall of the first liner 50 after the lateral recessing of the peripheral portion of the second liner 70 above the first gate stack (30A, 38A). In one embodiment, the surface 79 of the second liner 70 can have a concave curvature.

In one embodiment, the first device region 100 includes a first field effect transistor, and the second device region 200 includes a second field effect transistor. The first liner 50 overlies the first field effect transistor and does not overlie the second field effect transistor, and the second liner 70 overlies the second field effect transistor and does not overlie the first field effect transistor. One of the first field effect transistor and the second field effect transistor can be a p-type field effect transistor, and another of the first field effect transistor and the second field effect transistor can be an n-type field effect transistor. Further, one of the first liner 50 and the second liner 70 can be a compressive-stress-generating liner, and another of the first liner 50 and the second liner 70 can be a tensile-stress-generating liner. In one embodiment, one of the first and second liners (50, 70) can be a compressive-stress-generating liner that overlies a p-type field effect transistor, and another of the first and second liners (50, 70) can be a tensile-stress-generating liner that overlies an n-type field effect transistor.

Figure 7:
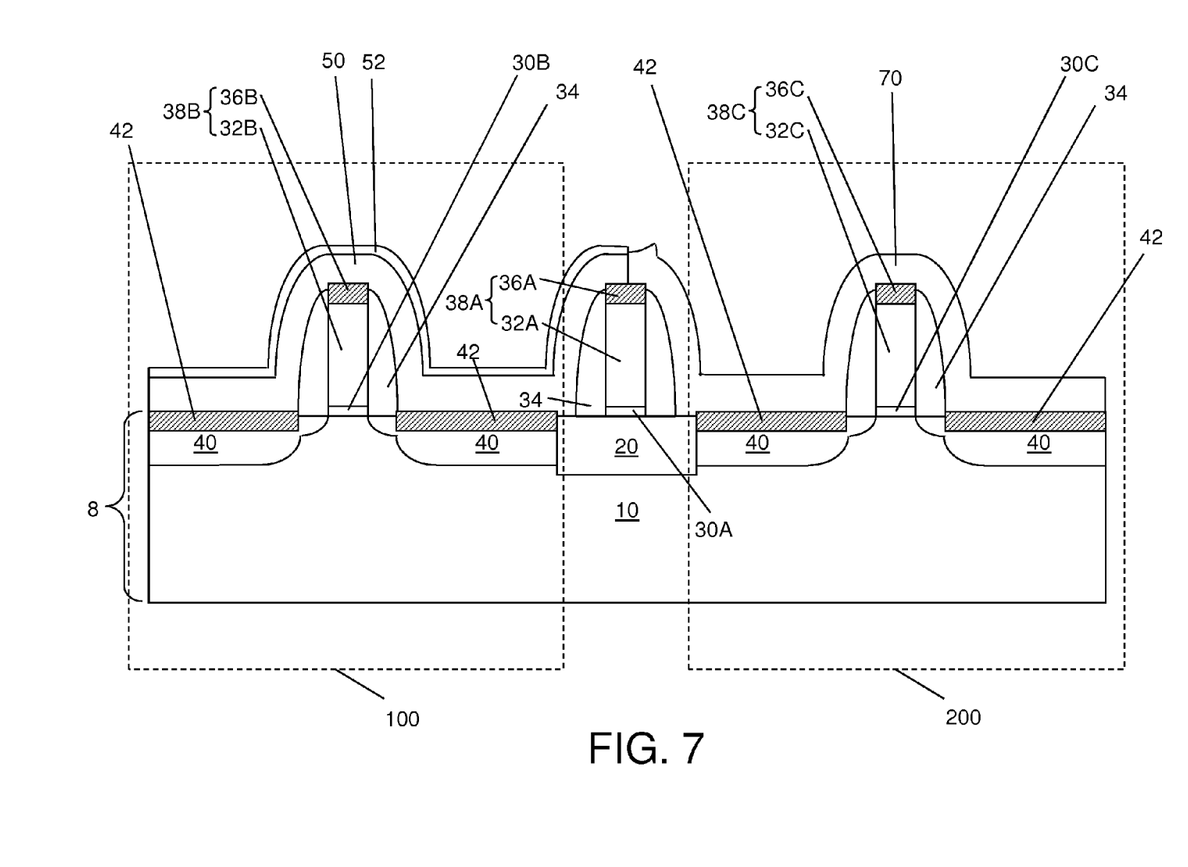
FIG. 7 is a vertical cross-sectional view of the exemplary semiconductor structure after removal of the masking layer according to an embodiment of the present disclosure.

Referring to FIG. 7, the masking layer 77 is removed selective to the dielectric material layer 52 and the second liner 70, for example, by ashing.

Figure 8:
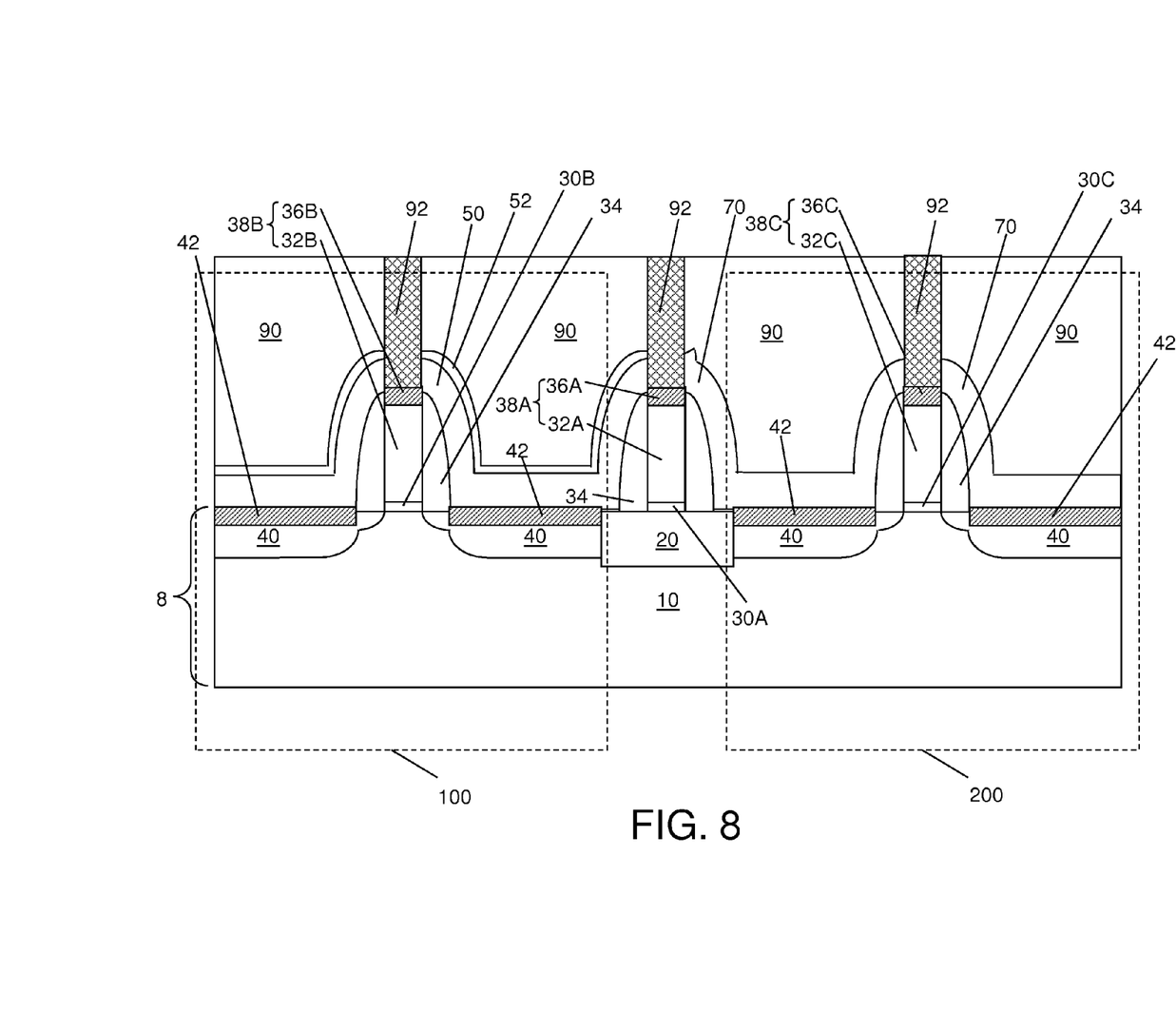
FIG. 8 is a vertical cross-sectional view of the exemplary semiconductor structure after formation of a contact-level dielectric layer and contact via structures according to an embodiment of the present disclosure.

Referring to FIG. 8, a contact-level dielectric layer 90 is deposited over the dielectric material layer 52 and the second liner 70. The contact-level dielectric layer 90 includes a dielectric material such as silicon oxide, silicon nitride, silicon oxynitride, porous or non-porous organosilicate glass, or a combination or a stack thereof. Optionally, the top surface of the contact-level dielectric material layer 90 can be planarized, for example, by depositing a self-planarizing dielectric material or by planarizing a deposited dielectric material by chemical mechanical planarization (CMP).

Various contact via structures can be formed within the contact-level dielectric layer 90, for example, by forming various contact via holes and filling the various contact via holes with a conductive material such as doped polysilicon, W, Ti, Ta, WN, TiN, TaN, Cu, Al, or a combination thereof. The various contact via structures can include gate-level contact via structures 92 and source/drain contact via structures 94.

Figure 9:
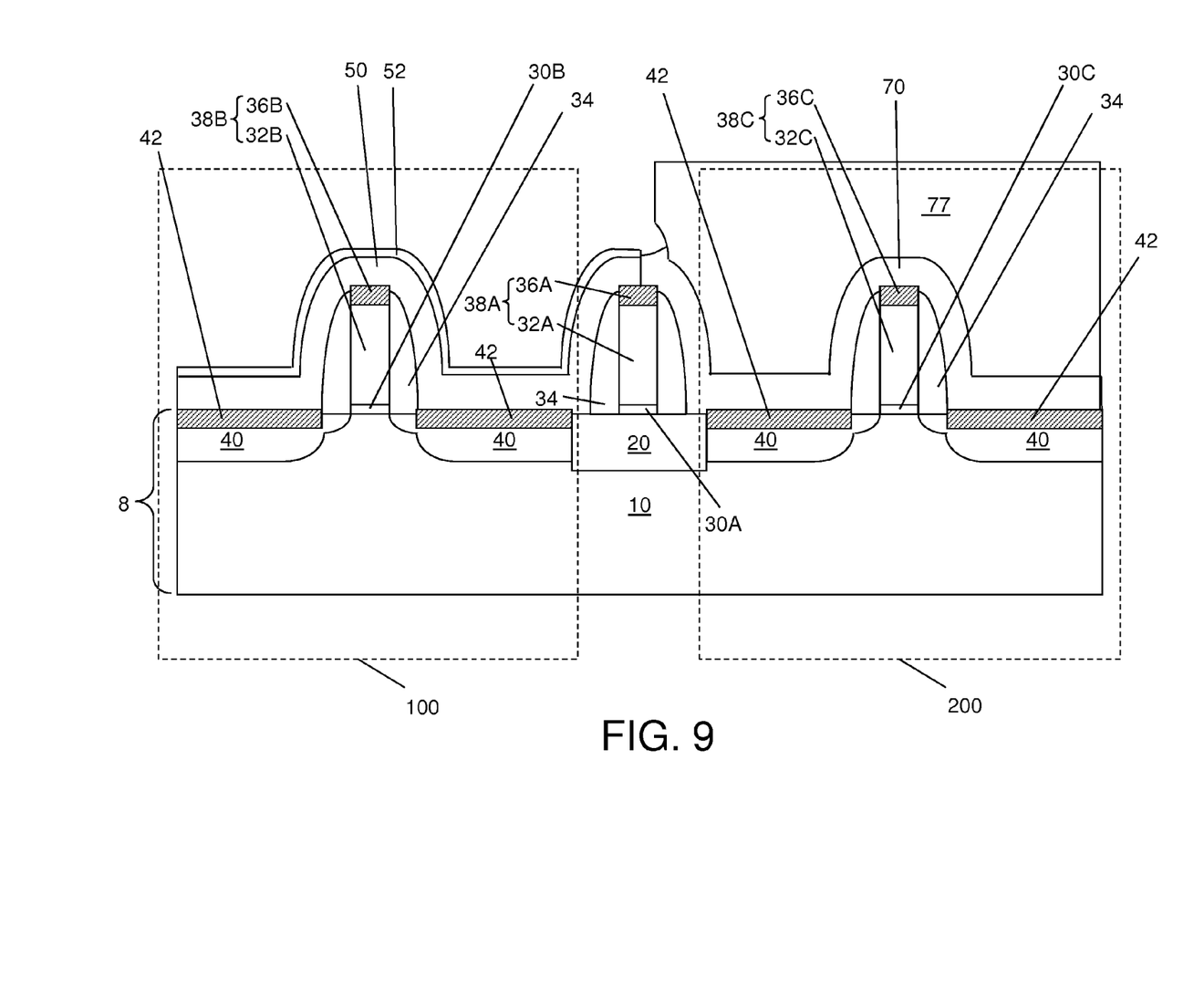
FIG. 9 is a vertical cross-sectional view of a variation of the exemplary semiconductor structure in which the masking layer is laterally recessed during the lateral recess of the second liner according to an embodiment of the present disclosure.

Referring to FIG. 9, a variation of the exemplary semiconductor structure is illustrated at a processing step corresponding to FIG. 6. In this variation, the masking layer 77 can be laterally recessed during the lateral recess of the second liner 70, i.e., during the second etch step. The masking layer 77 is subsequently removed. The structure illustrated in FIGS. 7 and 8 can be subsequently formed.

The use of the isotropic dry etch to laterally recess the peripheral portions of the second liner 70 from underneath an edge of the masking layer 77 can simplify the processing steps employed to remove the overlap of the first liner 50 and the second liner. If the same isotropic dry etch is employed for the first etch and the second etch of FIG. 6, a single continuous isotropic dry etch process can be employed to remove the physically exposed portions of the second liner 70 and the peripheral portions of the second liner 70 that overlie peripheral portions of the first liner 50.

By removing the overlapping portions of the first and second liners (50, 70), i.e., by removing the portions of the second liner 70 that overlie the first liner 50, formation of contact via holes to a border between the first liner 50 and the second liner 70 can be performed reliably without an etch residue. Specifically, because regions that include a stack of the first liner 50, the dielectric material layer 52, and the second liner 70 are eliminated by the lateral recessing of the second liner 50 from above peripheral portions of the first liner 50, the first liner 50 or the second liner 70 can be completely and reliably removed at a bottom of contact via holes. Thus, contact via structures (92, 94) formed at a junction between the first liner 50 and the second liner 70 can make a physical contact with an underlying conductive structure, e.g., the first gate electrode 38A, even at a junction between the first liner 50 and the second liner 70.

While the present disclosure has been particularly shown and described with respect to preferred embodiments thereof, it will be understood by those skilled in the art that the foregoing and other changes in forms and details may be made without departing from the spirit and scope of the present disclosure. Each of the various embodiments of the present disclosure can be implemented alone, or in combination with any other embodiments of the present disclosure unless expressly disclosed otherwise or otherwise impossible as would be known to one of ordinary skill in the art. It is therefore intended that the present disclosure not be limited to the exact forms and details described and illustrated, but fall within the scope of the appended claims.

What is claimed is:

1. A method of fabricating a semiconductor structure, comprising:
   forming a first liner over a first portion of a semiconductor substrate;
   forming a second liner over a second portion of said semiconductor substrate, wherein said second liner overlies said first liner;
   depositing a masking layer over said first liner and said second liner;
   forming a sidewall of said masking layer above a top surface of a peripheral portion of said first liner by patterning said masking layer;
   removing portions of said second liner that are not covered by said patterned masking layer; and
   laterally recessing said second liner from underneath said patterned masking layer, causing a peripheral portion of said second liner to be removed from above said peripheral portion of said first liner, wherein the peripheral portion of said first liner is present on a gate structure that is located on an isolation region separating the first portion of the semiconductor substrate from the second portion of the semiconductor substrate.

2. The method of claim 1, wherein said lateral recessing of said peripheral portion of said second liner is performed employing a dry etch.

3. The method of claim 2, wherein said dry etch is an isotropic dry etch.

4. The method of claim 3, wherein said isotropic dry etch is a chemical downstream etch that generates a reactive ion or a radical in a chamber different from a chamber in which said semiconductor substrate is loaded.

5. The method of claim 1, wherein said forming of said first liner comprises depositing one of said first liner and said second liner as a tensile-stress-generating silicon nitride liner, and said forming of said second liner comprises depositing another of said first liner and said second liner as a compressive-stress-generating silicon nitride liner.

6. The method of claim 1, wherein said masking layer is a photoresist layer, and said patterning of said masking layer is performed by lithographic exposure and development of said photoresist layer.

7. A method of fabricating a semiconductor structure, comprising:
   forming one of a tensile-stress-generating liner and a compressive-stress-generating liner as a first liner over a first portion of a semiconductor substrate;
   forming another of said tensile-stress-generating liner and said compressive-stress-generating liner as a second liner over a second portion of said semiconductor substrate, wherein said second liner overlies said first liner;
   depositing a masking layer over said first liner and said second liner;
   forming a sidewall of said masking layer above a top surface of a peripheral portion of said first liner by patterning said masking layer;

removing portions of said second liner that are not covered by said patterned masking layer; and laterally recessing said second liner from underneath said patterned masking layer, causing a peripheral portion of said second liner to be removed from above said peripheral portion of said first liner, wherein the peripheral portion of said first liner is present on a gate structure that is located on an isolation region separating the first portion of the semiconductor substrate from the second portion of the semiconductor substrate.

8. The method of claim 7, further comprising forming a dielectric material layer having a different composition than said first liner directly on said first liner prior to forming said second liner.

9. The method of claim 8, wherein said forming of said tensile-stress-generating liner comprises depositing a tensile-stress-generating silicon nitride liner as said tensile-stress-generating liner, said forming of said compressive-stress-generating liner comprises depositing a compressive-stress-generating silicon nitride liner as said compressive-stress-generating liner, and said forming of said dielectric material layer comprises depositing a silicon oxide layer as said dielectric material layer.

10. The method of claim 9, wherein said lateral recessing is performed employing a plasma of at least one of $NF_3$ and $NH_3$.

11. The method of claim 8, further comprising patterning said dielectric material layer to form a sidewall of said dielectric material layer prior to said forming of said sidewall of said patterned masking layer, wherein a sidewall of said first liner is formed to be vertically coincident with said sidewall of said dielectric material layer.

12. The method of claim 11, wherein said forming of said second liner comprises depositing said second liner directly on said sidewall of said dielectric material layer and said sidewall of said first liner.

13. The method of claim 11, further comprising forming a gate stack on said semiconductor substrate, wherein said sidewall of said dielectric material layer and said sidewall of said first liner is formed above a top surface of said gate stack.

14. The method of claim 11, further comprising recessing a surface of said second liner to a location at which said recessed surface of said second liner adjoins one of said sidewall of said dielectric material liner and said sidewall of said first liner simultaneously with said lateral recessing of said peripheral portion of said second liner.

15. The method of claim 14, further comprising etching said surface of said second liner as a surface having a concave curvature.

16. The method of claim 11, further comprising protecting said first liner with said dielectric material layer while said second liner is laterally recessed.

17. A method of fabricating a semiconductor structure, comprising:

forming a first field effect transistor over a first portion of a semiconductor substrate and forming a second field effect transistor over a second portion of said semiconductor substrate;

forming a first liner over said first and second field effect transistors;

removing a portion of said first liner from above said second field effect transistor;

forming a second liner over said first and second field effect transistors and over said first liner;

removing said second liner from above said first field effect transistor;

depositing a masking layer over said first liner and said second liner;

forming a sidewall of said masking layer above a top surface of a peripheral portion of said first liner by patterning said masking layer;

removing portions of said second liner that are not covered by said patterned masking layer; and laterally recessing said second liner from underneath said patterned masking layer, causing a peripheral portion of said second liner to be removed from above said peripheral portion of said first liner, wherein the peripheral portion of said first liner is present on a gate structure that is located on an isolation region separating the first portion of the semiconductor substrate from the second portion of the semiconductor substrate.

18. The method of claim 17, wherein said forming of said first field effect transistor comprises forming one of a p-type field effect transistor and an n-type field effect transistor as said first field effect transistor, and said forming of said second field effect transistor comprises forming another of said p-type field effect transistor and said n-type field effect transistor as said second field effect transistor.

19. The method of claim 18, wherein said forming of said first liner comprises forming one of a compressive-stress-generating liner and a tensile-stress-generating liner as said first liner, and said forming of said second liner comprises forming another of said compressive-stress-generating liner and said tensile-stress-generating liner as said second liner.

20. The method of claim 19, wherein said removing of said portion of said first liner and said removing of said second liner comprise:

removing a portion of said compressive-stress-generating liner from above said n-type field effect transistor; and removing a portion of said tensile-stress-generating liner from above said p-type field effect transistor.

* * * * *